(12) United States Patent
Orthner

(10) Patent No.: US 7,827,517 B1
(45) Date of Patent: Nov. 2, 2010

(54) AUTOMATED REGISTER DEFINITION, BUILDER AND INTEGRATION FRAMEWORK

(75) Inventor: Kent Orthner, Kanata (CA)

(73) Assignee: Altera Corporation, San Jose, CA (US)

( * ) Notice: Subject to any disclaimer, the term of this patent is extended or adjusted under 35 U.S.C. 154(b) by 1092 days.

(21) Appl. No.: 11/419,305

(22) Filed: May 19, 2006

(51) Int. Cl.
G06F 17/55 (2006.01)
G06F 9/455 (2006.01)
G06F 17/50 (2006.01)

(52) U.S. Cl. ............... 716/18; 716/1; 716/3; 716/4; 716/8; 716/9; 716/11; 703/14

(58) Field of Classification Search ............ 716/1, 716/4, 11, 17, 18; 703/14
See application file for complete search history.

(56) References Cited

U.S. PATENT DOCUMENTS

| | | | | |
|---|---|---|---|---|
| 5,995,736 A * | 11/1999 | Aleksic et al. | ............ | 716/18 |
| 6,408,428 B1 * | 6/2002 | Schlansker et al. | ............ | 716/17 |
| 6,651,222 B2 * | 11/2003 | Gupta et al. | ............ | 716/1 |
| 6,901,565 B2 * | 5/2005 | Sokolov | ............ | 716/4 |
| 6,959,428 B2 * | 10/2005 | Broberg et al. | ............ | 716/18 |
| 6,968,516 B2 * | 11/2005 | Kanda et al. | ............ | 716/1 |
| 7,036,106 B1 * | 4/2006 | Wang et al. | ............ | 716/18 |
| 7,277,965 B2 * | 10/2007 | Meyer et al. | ............ | 710/8 |
| 7,353,489 B2 * | 4/2008 | Dowling | ............ | 716/18 |
| 7,409,652 B1 * | 8/2008 | Fox et al. | ............ | 716/4 |
| 2005/0049843 A1 * | 3/2005 | Hewitt et al. | ............ | 703/14 |
| 2007/0234249 A1 * | 10/2007 | Kowatari et al. | ............ | 716/5 |
| 2008/0034334 A1 * | 2/2008 | Laouamri et al. | ............ | 716/4 |
| 2009/0222778 A1 * | 9/2009 | Goto | ............ | 716/5 |

OTHER PUBLICATIONS

Kirovski et al.; "Engineering change protocols for behavioral and system synthesis"; Publication Year: 2005; Computer-Aided Design of Integrated Circuits and Systems, IEEE Transactions on; vol. 24 , Issue: 8; pp. 1145-1155.*

* cited by examiner

Primary Examiner—Helen Rossoshek
(74) Attorney, Agent, or Firm—Martine Penilla & Gencarella, LLP

(57) ABSTRACT

A system for designing an integrated circuit is provided. The system includes a plurality of class databases having register information extracted from a register entry tool. A system integration tool is used to integrate the register information from each of the class databases into a system database. The system integration tool essentially consolidates the class databases and maintains a base address for the various components. A system application module includes a number of application tools, which may be referred to as generators. The application tools include, among other tools, a document generator tool, a hardware description language (HDL) generator, a hardware abstraction layer (HAL) generator, and a test framework. A method of designing a circuit is also provided.

19 Claims, 6 Drawing Sheets

| | | type | bitfieldname | width | reset | signalname | enumeration | description (NO commas Allowed) |
|---|---|---|---|---|---|---|---|---|
| 1 | | | | | | | | |
| 2 | classname | altera_atlantic_data_source | | | | | | |
| 3 | modulename | ${module_name}_regs | | | | | | |
| 4 | name | Atlantic Data Source | | | | | | |
| 5 | technology | Atlantic | | | | | | |
| 6 | | | | | | | | |
| 7 | | | | | | | | |
| 8 | | | | | | | | |
| 9 | REGLIST | | | | | | | |
| 10 | registername | type | bitfieldname | width | reset | signalname | enumeration | description (NO commas Allowed) |
| 11 | id | constant | core_id | 16 | 16'hA200 | | | |
| 12 | | | core_version | 16 | 16'h00 | | | |
| 13 | | | | | | | | |
| 14 | control | rw | throttle | 8 | 0 | av_throttle | | Controls the rate of data transfer (while still controlled by - if enabled) 0 means no data - 7F means full on |
| 15 | | | burstsize | 8 | 8'h10 | av_burstsize | | This controls the size of bursts sent in units of interleave_ granularity |
| 16 | | | enable | 1 | 0 | av_enable | | Allows the transmitter to go |
| 17 | | | | | | | | |
| 18 | data_count | count_rollover | data_count | 32 | 0 | av_count_data | | The number of bursts sent |
| 19 | burst_count | count_rollover | burst_count | 32 | 0 | av_count_burst | | The number of bursts sent |
| 20 | packet_count | count_rollover | packet_count | 32 | 0 | av_count_packet | | The number of bursts sent |
| 21 | | | | | | | | |
| 22 | empty_insert | rw | empty_insert | 8 | 0 | av_empty_inset | | Writing n to this register causes n empty symbols to be inserted on the |
| 23 | | | | | | | | |
| 24 | error_insert | rw | error_insert | 8 | 0 | av_error_inset | | Writing n to this register causes an error of n to be inserted on the next |
| 25 | | | | | | | | |
| 26 | data_error_insert | rw | data_error_insert | 32 | 0 | av_data_error_insert | | |

AUTOMATED REGISTER DEFINITION, BUILDER AND INTEGRATION FRAMEWORK

BACKGROUND

As integrated circuits become more sophisticated, the design of the circuit is becoming more complex. While electronic design automation (EDA) tools are available to assist in the design of these complex circuits, these EDA tools still require a great deal of intensive labor from design engineers. In addition, the EDA tools tend to generate a large amount of data that design engineers must manually sift through.

Many Intellectual Property (IP) cores included in the system designs have a control and status interface that consists of a number of registers. Even with the multitude of EDA tools available, there is no standardized format of specifying these registers and building the register transfer logic (RTL) to implement the registers.

As a result, there is a need to standardize the specification of the control and status registers of IP blocks so that additional functionality may be applied to enhance the design process.

SUMMARY

Embodiments of the present invention provide a method and a framework to generate additional data based on a register entry tool to enhance the design process. It should be appreciated that the present invention can be implemented in numerous ways, such as a process, an apparatus, a system, a device or a method on a computer readable medium. Several inventive embodiments of the present invention are described below.

In one aspect of the invention, a method generating a circuit design is provided. The method identifies the characteristics for each block of a circuit in a register entry tool. In one embodiment, the characteristics are captured in table format. The data in the register entry tool is accessed through an application programming interface and stored in a database. The data within the database is then processed to generate various information that would enhance the design process. For example, user documentation, software drivers, testing parameters may be generated through the generators processing the data within the database.

In another aspect of the invention, a system for designing an integrated circuit is provided. The system includes a plurality of class databases having register information extracted from a register entry tool. In one embodiment, each of the class databases corresponds to a functional block of the integrated circuit in a one-to-one manner. A system integration tool is used to integrate the register information from each of the class databases into a system database. The system integration tool essentially consolidates the class databases and maintains a base address for the various components. A system application module includes a number of application tools, which may be referred to as generators. The application tools include a document generator tool capable of generating user documentation for the integrated circuit, a hardware description language (HDL) generator enabling a user to substitute a fixed configuration for a configurable register after designing the integrated circuit, a hardware abstraction layer (HAL) generator that can generate drivers so that the designer can call a certain method, and a test framework for generating tests of the eventual silicon chip. Other generators may be included as described below.

Other aspects of the invention will become apparent from the following detailed description, taken in conjunction with the accompanying drawings, illustrating by way of example the principles of the invention.

BRIEF DESCRIPTION OF THE DRAWINGS

The invention may best be understood by reference to the following description taken in conjunction with the accompanying drawings in which:

FIG. 2 illustrates an exemplary register entry tool in accordance with one embodiment of the invention.

DETAILED DESCRIPTION

The embodiments described herein provide a tool for simplifying the design of integrated circuits. It will be obvious, however, to one skilled in the art, that the present invention may be practiced without some or all of these specific details. In other instances, well known process operations have not been described in detail in order not to unnecessarily obscure the present invention.

Intellectual property (IP) cores often have a control and status interface that includes a read/write register set to control the operation of the core, and to get information about its operation. The embodiments described below provide a technique for specifying these registers, compiling the registers in a database, building the register transfer logic (RTL) that implements the registers, and using the register database information to provide assistance to a chip designer in various functions of the chip design process. One skilled in the art will appreciate that IP blocks may be provided for various functionality, e.g., memory blocks, processor blocks, timer functionality, etc. Each of these IP blocks is associated with registers. The RTL is a programming language that can be used to describe what the registers do, i.e., the function for each register. The embodiments described herein document which registers a user wants and a tool will build the registers, rather than using a low-level language describing what the registers do each time. In essence, the technique describes the output desired for the registers and the tool builds the registers.

Figure 1:
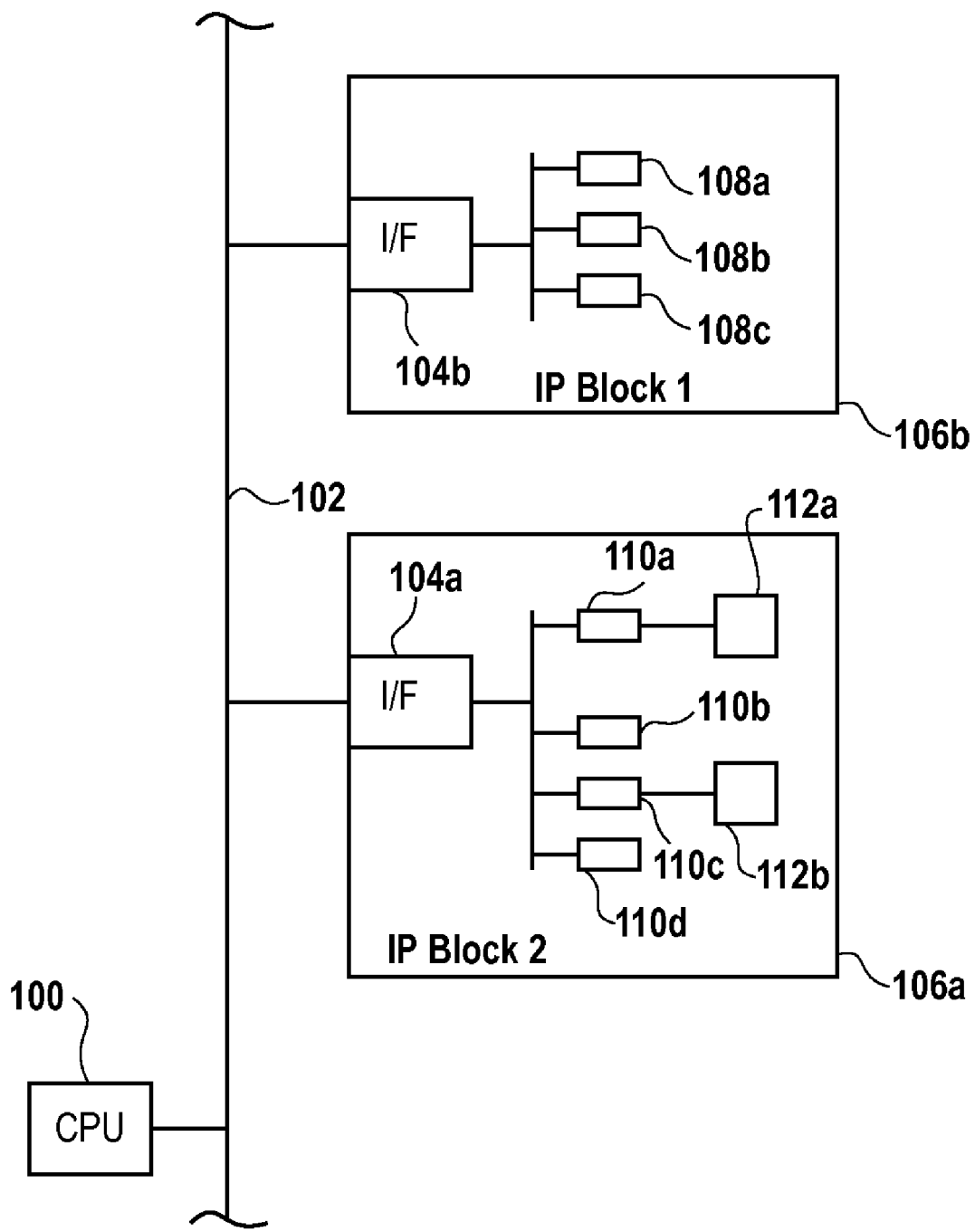
FIG. 1 is a high-level simplified schematic diagram of an exemplary system design in which the tool disclosed herein may be utilized in accordance with one embodiment of the invention.

FIG. 1 is a high-level simplified schematic diagram of an exemplary partial system design in which the tool disclosed herein may be utilized in accordance with one embodiment of the invention. Central processing unit (CPU) 100, IP block 1 106b, and IP block 2 106a are included in the system. It should be appreciated that additional IP blocks may be provided in the system as well as other functional modules and that IP blocks 1 and 2 are illustrated for exemplary purposes only. IP block 106a includes interface 104a, which communicates with CPU 100 through bus 102. IP block 106a further includes registers 110a through 110d. In the exemplary design of the system of FIG. 1, register 110a may provide a control status for block 112a. When writing the RTL for such a design there may be pages of hardware description language (HDL) that may communicate certain operations to be performed when the data within registers 110a and 110c are certain values. For example, CPU 100 may write in a code of "73" into register 110a, which triggers a signal to block 112a in response to the value within register 110a. It should be appreciated that these numerous codes, which trigger some type of response are captured in the voluminous pages of the IP component description. Similar to IP block 2 106a, IP block 1 106b includes an interface 104b that communicates with registers 108a through 108c. Registers 108a-c may also provide control to the core of IP block 1 106b.

FIG. 2 illustrates an exemplary register entry tool in accordance with one embodiment of the invention. In FIG. 2, a spreadsheet format containing tabular data is illustrated. The table of FIG. 2 indicates what is desired by the designer and is used to generate the HDL description in accordance with one embodiment of the invention. In other words, characteristics of the registers are provided in the register entry tool. Looking at the table of FIG. 2, it should be appreciated that a first register having a register name as "id" is a constant-type register having two sixteen-bit fields referred to as "core_id" and "core_version." The reset value is further provided in an additional column of the register entry tool. While the register named "id" does not have any data within the signal name column, enumeration column, or description column, the register named "control" listed there below, has data within the signal name and description columns. For example, the register named "control" includes three bit fields of throttle, burst size, and enable. The throttle field is eight bits wide, the burst size field is eight bits wide and the enable field is one bit. The signal names are provided in the corresponding column of the register entry tool, and corresponding description comments are provided also. When the value of the register is limited to well defined values, the definitions of these values is described in the enumeration column. It should be appreciated that instead of numerous pages and pages of Verilog data, a table, such as the register entry tool of FIG. 2, is populated with the characteristics for the registers for each block. In one embodiment, the data in the table may be thought of as describing the result of the Verilog data. A software program, e.g., PERL script, looks at these results provided in the register entry tool of FIG. 2 and then generates a Verilog data sheet for the design of the circuit, chip, or system. In one embodiment, a table such as the table of FIG. 2 exists for each functional block or IF core in the design. As mentioned above, the register entry tool illustrated in FIG. 2 may be referred to as a register entry tool and while a spreadsheet format, e.g., such as MICROSOFT EXCEL is illustrated, this is not meant to be limiting. That is, any table format may be used for the register entry tool.

Figure 3:
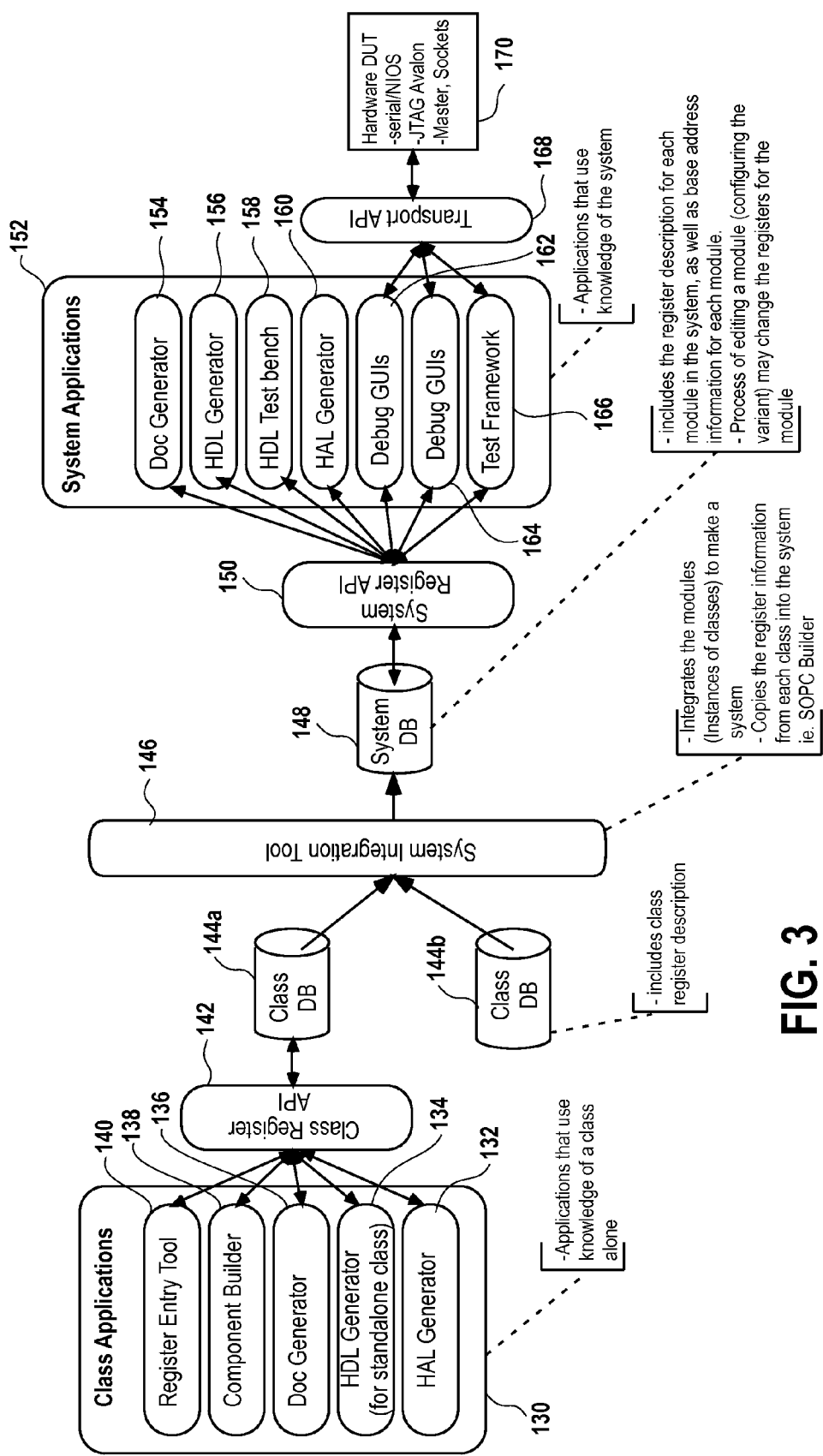
FIG. 3 is a simplified schematic diagram of the block and system level framework in accordance with one embodiment of the invention.

FIG. 3 is a simplified schematic diagram of the functional block and system level framework for a tool that generates information from the register entry tool in accordance with one embodiment of the invention. Application module 130 includes applications that use the data of FIG. 2, which is captured in class data base 144a. Application module 130 includes class applications, such as, hardware abstraction language (HAL) generator 132, hardware description language generator 134, document generator 136, component builder 138, and register entry tool 140. Application module 130 essentially includes the different class applications that provide various functionality and generate information based on the data within the register entry tool of FIG. 2, as described herein. Class register application programming interface (API) 142 represents a software module, e.g., a PERL script, that takes the information from the register entry tool 140 of FIG. 2, and generates the HDL for the chip design as described below. As mentioned above, the data represented in FIG. 2 is accessed and reformatted to be stored in the corresponding class database of the framework of FIG. 3.

Still referring to FIG. 3, various functionality provided by the class applications of application module 130 are described below. Document generator 136 builds a file, e.g., a web page, a portable document format (PDF) file, etc., for insertion into a user guide for the design provided by the system. These documents may be utilized for technical writers of a chip design process in order to generate a specification that designers can use. For example, referring top the register named "control" in FIG. 2, when a value is written into the field of the control register at a certain address, a certain function is thereafter triggered. Document generator 136 captures the numerous codes and triggered functions/response for insertion into a user guide. The class register API 142 accesses the data from the register entry tool and places this data into class database 144a. From the data in class database 144a, a document is generated by document generator 136, which specifies when a certain value is written into a particular register a certain operation will be triggered. With respect to the control register mentioned above in FIG. 2, a value written into the throttle bit field will control the rate of data transfer. For exemplary and illustrative purposes, a value of 7 F means full on while a zero means no data, i.e., this field is not enabled. The document generator captures these values and corresponding triggered operations so that a specification may be generated for a chip or system design.

HAL generator 132 of FIG. 3 may be used to create an executable code segment from the data of class database 144a in order to simplify certain aspects of the design. These aspects may be aspects that designers may not be interested in coding. For example, with respect to an Ethernet interface, there are a number of steps to get a data packet in and out of a core for a CPU to eventually utilize the data within the data packet. With respect to an Ethernet interface, it may be necessary to determine if the status register indicates a packet was received and if so, check another register as to where the status packet is located, among other tasks. Thereafter, the packet must be read out from this location. A programmer interested in receiving a packet may not be interested in these details. Thus, HAL generator 132 is utilized to build a software program that will obtain the packet so the programmer does not have to generate the program. In essence, HAL generator 132 will provide a macro that the programmer can call, e.g., a get-packet macro for the above example, from the data in class database 144a. Consequently, the code for accessing the core is simplified for an eventual user should they desire not to generate their own code for accessing the core. It should be appreciated that while a specific example of an Ethernet Interface was discussed above for HAL generator 132, this example is not meant to be limiting as the HAL generator may provide the code necessary for any suitable operation necessary for the handling of data by the chip that may enhance the design process.

Component builder module 138 of FIG. 3 offers an alternative to the register entry table of FIG. 2. In some instances, programmers may have already designed the complete Verilog file rather than utilizing the register entry table of FIG. 2. In this embodiment, component builder 138 is configured to parse through the Verilog file in order to generate the register entry table of FIG. 2. In essence, component builder 138 identifies each of the control and status registers so that the table of FIG. 2 may be generated in order to provide the additional functionality described with each of the modules of class application module 130. HDL generator 134 can read the database file and produce RTL such as VHDL or verilog that provides a hardware description of the desired register set. This HDL can subsequently be compiled into the logic required to implement the register set, eliminating the need for the circuit designer to design the hardware manually.

It should be appreciated that class register API 142 reads the register entry table depicted in FIG. 2 and changes this table into class database format. Table 1 illustrates an exemplary class database format.

TABLE 1

```
AVALON_REGISTERS
{
    technology = "Atlantic";
    name = "Atlantic Data Source";
    modulename = "$ {module_name} _regs";
    classname = "altera_atlantic_data_source";
    REGISTER id
    {
        width = "32";
        address = "0";
        type = "constant";
        BITFIELD core_id
        {
            bitfieldname = "core_id";
            bitfield = "15:0";
            enumeration = "";
            signalname = "";
            description = "";
            reset = "16'hA200";
        }
        BITFIELD core_version
        {
            bitfieldname = "core_version";
            bitfield = "31:16";
            enumeration = "";
            signalname = "";
            description = "";
            reset = "16'h00";
        }
    }
    REGISTER control
    {
        width= "17";
        address = "1";
        type = "rw";
        BITFIELD throttle
        {
            bitfieldname = "throttle";
            bitfield = "7:0";
            enumeration = "";
            signalname = "av_throttle";
            description = "";
            reset = "0";
        }
        BITFIELD burstsize
        {
            bitfieldname = "burstsize";
            bitfield = "15:8";
            enumeration = "";
            signalname = "av_burstsize";
            description = "";
            reset = "8'h10";
        BITFIELD enable
        {
        }
            bitfieldname = "enable";
            bitfield = "16:16";
            enumeration = "";
            signalname = "av_enable";
            description = "";
            reset = "0";
        }
    }
}
```

As depicted in Table 1, the "id" register is first specified as having a width of 32 bits, an address offset of "0" and is a constant type. Other characteristics are defined as specified within Table 1. The next exemplary register is named "control" and is 17 bits wide having an address that is one. The type of register is a read/write register and within the register there is an 8-bit field that is referred to as throttle. There is also an 8-bit field referred to as burst size and a one-bit field called enable. Further registers can be provided having widths, names, addresses and type data as illustrated with regard to Table 1. One skilled in the art should appreciate that Table 1 is provided as an exemplary database format and is not meant to be limiting, as any suitable format may be used that enables the functionality provided herein. In addition, other characteristics commonly associated with registers may be included. Furthermore, the format provided in Table 1 is stored within class databases 144a and 144b of FIG. 3. In one embodiment, a class database exists for each block, thus class database 144a corresponds to a first block, while class database 144b corresponds to a second block. As previously stated, the class databases 144a and 144b include class register descriptions having a format illustrated in Table 1. Class databases 144a and 144b are capable of being accessed by system integration tool 146. In one embodiment, system integration tool 146 represents the System On A Programmable Chip (SOPC) builder currently owned by the assignee. However, any suitable electronic design automation (EDA) software module having the system integration capability may be used here. In one embodiment, system integration tool 146 integrates the modules, e.g., instances of classes to design a system from each of the blocks embodied in the class databases. Thus, through system integration tool 146, a system view is provided for each of the individual blocks.

Still referring to FIG. 3, system database 148 includes the register description for each module in the system, as well as base address information for each module. In one embodiment, a designer is able to edit a module, i.e., configure a variant, and may change the registers for the module. System register application programming interface 150 is a software tool which accesses the data within system database 148 in order to provide various functionality through system application module 152. In essence, system application module 152 includes applications that use the knowledge of the system provided through system integration tool 146 and system database 148, in order to generate further functionality enhancing the system design process. As system database 148 has knowledge of the base address for various blocks within the system, a file may be generated so that rather than specifying the base address of a register each time, as required by Verilog output, an HTML file may be generated that defines the base address as a control register for the core. In essence, the designer is provided a higher extraction level from the bit level so that less errors may be made and the process enhanced. The applications within system application module 152 include document generator 154, which has the capability of generating documents on a system level rather than just the individual block level. The functionality provided by document generator 136 of the class level can now be extrapolated to the system level through document generator 154. HAL generator 160 has system knowledge in this framework and may be utilized to further enhance the design process as described in more detail below with regard to FIG. 4.

Figure 4:
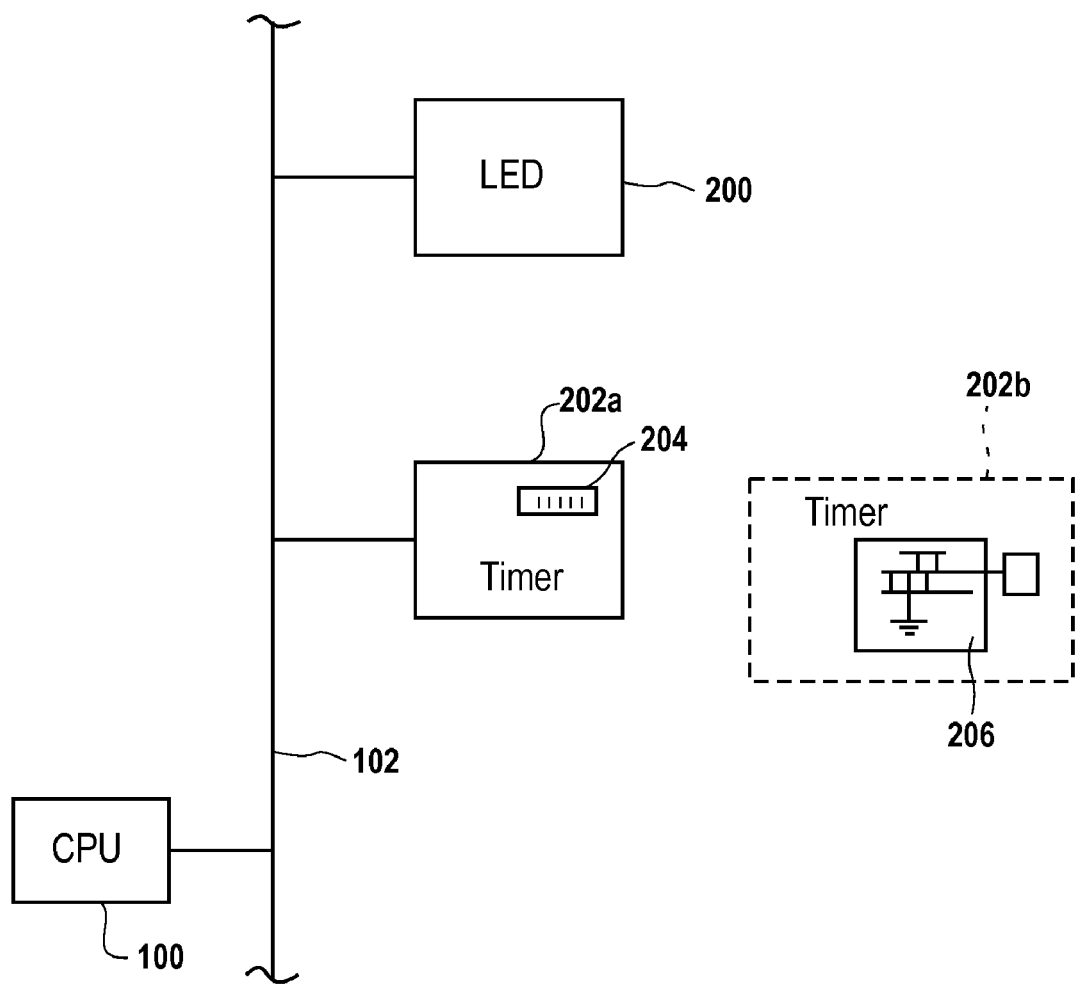
FIG. 4 illustrates an exemplary LED and timer block within a system in accordance with one embodiment of the invention.

FIG. 4 illustrates an exemplary LED and timer block within a system in accordance with one embodiment of the invention. The system includes LED block 200 and timer block 202a. CPU 100 communicates with LED 200 and timer block 202a through bus 102. As is readily known, LED block 200 may contain a number of bits where each bit corresponds to a light. With system knowledge that a timer block is included, HAL module 160 of FIG. 3 is capable of generating a program in which the timer is controlling the blinking of the lights of LED module 200. For example, the timer can be programmed to send an interrupt every five seconds, wherein the lights are turned off and then another five seconds the lights are turned on. It should be appreciated that this would be impossible to do without the system knowledge provided through system integration tool 146 and system database 148 of FIG. 3.

HDL generator 156 of FIG. 3 may be used to generate variants of certain configurations based on the system knowledge. For example, if a user wants to configure the blinking of the lights to occur every five seconds, and does not want this to be changed, HDL generator 156, through the system knowledge, can be used to code the logic into the timer in order to eliminate the need for register 204 of timer 202a. This configuration is embodied in timer module 202b, which would be substituted for timer module 202a of FIG. 4. In one embodiment, the three bits are connected to a ground, while two bits are connected to a power supply in order to provide a constant five second time interval. Region 206 of timer 202b illustrates this configuration. Thus, HDL generator 156 saves logic and valuable chip real estate through the system knowledge and the exemplary configuration represented by timer 202b will be faster as there are no timing paths or information flow. Of course, HDL generator 156 is not limited to the above example. In another embodiment, HDL generator 156 may be used once the system level design is generated to optimize the design. With regard to variants, e.g., 1, 2. or 10 channel/ports for an Ethernet interface, HDL generator 156 can guarantee that the correct number of registers to support each variant are provided. This in turn eliminates the need to plan for a worse case and provide registers to meet a 10 channel variant when only a 1 or 2 channel variant is used. With the embodiments described herein, to go back and add registers if it is decided to move from a 1 channel variant to a 10 channel variant, the register can be added to the register entry tool and then the class database and the system database can be recompiled.

Still referring to FIG. 3, debug graphical user interface (GUI) 162 may be utilized to enhance actual testing of a silicon chip in accordance with one embodiment of the invention. Typically, it is necessary to write software to communicate with a chip when debugging the chip through any testing. Through debug GUI 162, a program can be generated to perform this testing through a graphical interface, which will enable a designer to more quickly perform the testing. For example, a window that is displayed where a designer can specify a throttle level to run a test can be programmed through debug GUI 162. In essence, since the registers are known, a program is written, e.g., in C code, that runs on WINDOWS, or other suitable operating system, to debug the chip. In one embodiment, debug GUI 162 enables a user to simply make a change into a table if a register was forgotten in the Verilog code and rather than recompile the entire design, that forgotten register is input to the register entry tool and the module/framework of FIG. 3 takes care of the rest.

Demo GUI 164 of FIG. 3 provides the functionality for a user to design a demonstration, which may be utilized at a trade show or other applicable event in accordance with one embodiment of the invention. In essence, demo GUI 164 accesses a library in order to make the chip do things to demonstrate it's functionality, e.g., cause blinking lights so that an audience may be able to observe this functionality. Test framework module 166 enhances the testing process by enabling a higher extraction level so that the user is farther from the bit level. For example, where a throttle level is set at a certain value the designer may set that value through test framework module 166. Test framework module 166, through a function, may set the throttling level, read back the throttling level to ensure that the write was successful, and then perform another action to verify that the component is operating with the desired throttle. It is then not necessary for the designer to specify the other steps required to be done when specifying the throttling level. HDL test bench generator 158 is used to design certain tests based on the system levels. For example, if there is a single Ethernet port to test, the test would be different than if ten Ethernet ports were provided. Through HDL test bench generator 158 the test for the one-port version and the ten-port version may be generated according to the system design. Knowledge of the system design will enable accommodation of single or multiple port versions of certain blocks, which can be generated through software code provided by HDL test bench generator 158. Transport API 168 represents software to link with another module or to communicate with a Verilog simulator. As illustrated, transport API 168 is in communication with Debug GUI 162, Demo GUI 164, and test framework 166. It should be appreciated that modules 162, 164, and 166 are associated with features for manipulating an actual silicon chip, therefore, transport API 168 provides a communication interface to achieve this manipulation. In one embodiment, transport API 168 enables communication with a JTAG engine for testing purposes. Module 170 represents an exemplary hardware device under test (DUT) module communicating through transport API 168. Module 170 may be any commercially available tester capable of testing the actual silicon chip.

Figure 5:
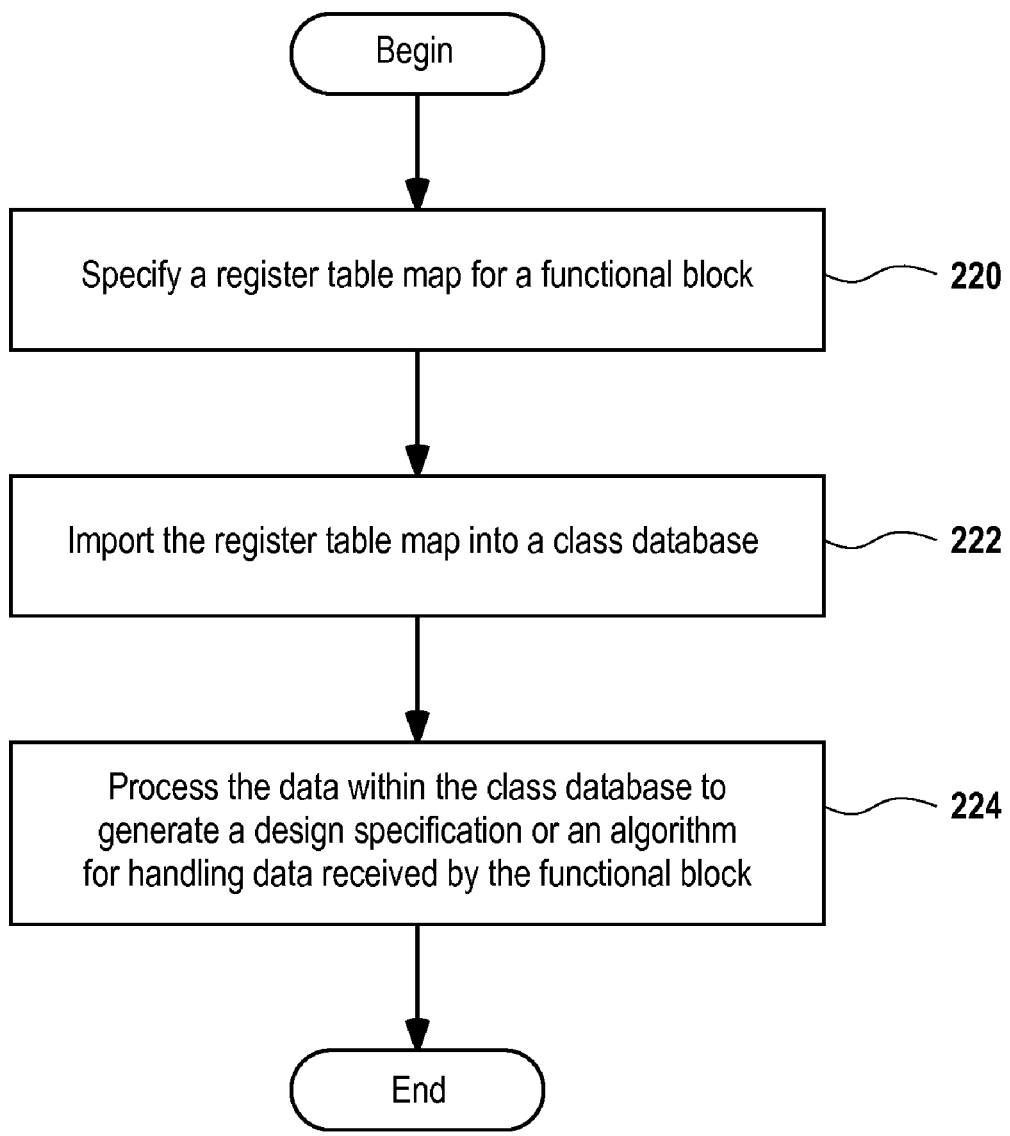
FIG. 5 is a flow chart diagram illustrating the method operations for generating a hardware description language for a circuit in accordance with one embodiment of the invention.

FIG. 5 is a flow chart diagram illustrating the method operations for generating a hardware description language for a circuit in accordance with one embodiment of the invention. The method initiates with operation 220 where a desired register map is specified. The register map is the register entry tool of FIG. 2 in one embodiment of the invention. The method then proceeds to operation 220 where the register map is imported into a database. Thus, the format described with regard to Table 1 may be imported into the class databases referred to in FIG. 3. In one embodiment, the class register API of FIG. 3 will access the data within the register entry tool and save the data in the class databases in the format with reference to Table 1. The method then advances to operation 224 where the class database is processed in order to provide the functionalities described in the class application module. More specifically, the component builder, document generator, HDL generator, and HAL generator and the corresponding functionalities may be provided by processing the data of the class database. In addition, a system integration tool may be utilized to integrate the data from each class database into a system database. A system register API will then access the data and a system view will enable further functionality as described with reference to FIG. 3 and the system applications.

Figure 6:
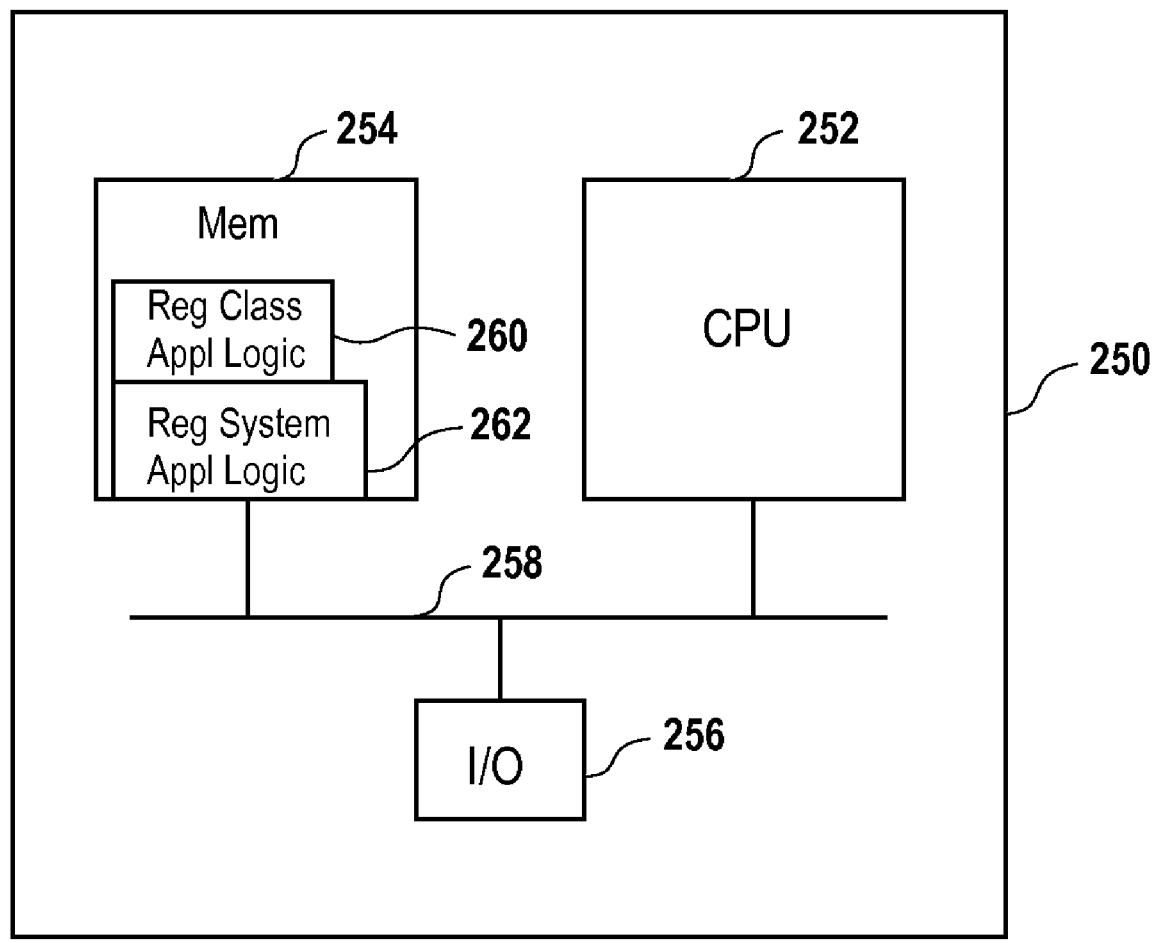
FIG. 6 is a simplified schematic diagram illustrating the system having the functionality described herein in accordance with one embodiment of the invention.

FIG. 6 is a simplified schematic diagram illustrating the system having the functionality described herein in accordance with one embodiment of the invention. System 250 includes CPU 252, memory 254, input/output module 256, all of which are in communication with each other through bus 258. Memory 254 includes register class application logic 260. Register class application logic 260 embodies the functionality described with reference to the left hand side, i.e., the block level, of FIG. 3. That is, the class application module and class register API provided in FIG. 3 and the corresponding functionality performed by the software is embodied by the register class application logic. Memory 254 further includes register system application logic 262, which essentially embodies the right-hand side of FIG. 3, i.e., the system level. Thus, the code within register system application logic 262 performs the functionality associated with the system application module and the system register API of FIG. 3.

A framework capable of generating additional information for machine readable IP blocks is provided. A machine readable register information database for each component or instance of a component is included. The database describes the component's control and status registers in a machine readable form. A table based mechanism, i.e., the register entry tool, and an API for accessing the information in the table, enables automatic generation of the register transfer logic, documentation, software drivers, component debug GUIs, and test frameworks. When integrated with a system tool, further functionality is included to assist in the design process.

Any of the operations described herein that form part of the invention are useful machine operations. The invention also relates to a device or an apparatus for performing these operations. The apparatus can be specially constructed for the required purpose, or the apparatus can be a general-purpose computer selectively activated or configured by a computer program stored in the computer. In particular, various general-purpose machines can be used with computer programs written in accordance with the teachings herein, or it may be more convenient to construct a more specialized apparatus to perform the required operations.

The invention can also be embodied as computer readable code on a computer readable medium. The computer readable medium is any data storage device that can store data, which can be thereafter be read by a computer system. The computer readable medium also includes an electromagnetic carrier wave in which the computer code is embodied. Examples of the computer readable medium include hard drives, network attached storage (NAS), read-only memory, random-access memory, CD-ROMs, CD-Rs, CD-RWs, magnetic tapes and other optical and non-optical data storage devices. The computer readable medium can also be distributed over a network-coupled computer system so that the computer readable code is stored and executed in a distributed fashion.

Although the foregoing invention has been described in some detail for purposes of clarity of understanding, it will be apparent that certain changes and modifications can be practiced within the scope of the appended claims. Accordingly, the present embodiments are to be considered as illustrative and not restrictive, and the invention is not to be limited to the details given herein, but may be modified within the scope and equivalents of the appended claims. In the claims, elements and/or steps do not imply any particular order of operation, unless explicitly stated in the claims.

What is claimed is:

1. A method for generating a circuit design, comprising method operations of:
    accessing a register table identifying characteristics of each register for a functional block of the circuit, the characteristics including a register name and a register type, wherein each register is divided into bit fields, each bit field having characteristics of a bit field name and a bit field width indicating a size of the bit field;
    importing data from the register table into a database; and
    processing the data imported into the database to generate a design specification for the functional block, the design specification being generated to implement the identified characteristics of each register,
    wherein each operation of the method is executed by a processor.

2. The method of claim 1, wherein the bit field has characteristics of a signal name for a signal associated with the bit field and a description associated with the bit field.

3. The method of claim 1, wherein the method operation of accessing a register table identifying characteristics of each register for a functional block of the circuit includes:
    identifying control and status registers defined in a hardware description language; and
    generating the register table from the identified control and status registers.

4. The method of claim 1, further comprising:
    repeating the accessing and the importing for each functional block of the circuit design; and
    integrating data from each database into a system database through a system integration tool, the integrating including assigning base address information to each functional block.

5. The method of claim 4, further comprising:
    processing the data integrated into the system database to generate a design specification for the circuit.

6. The method of claim 4, further comprising:
    processing the data integrated into the system database to generate testing data for use with a physical circuit.

7. The method of claim 4, further comprising:
    processing the data integrated into the system database to generate a software driver based on a system design defined by the data integrated into the system database.

8. The method of claim 1, wherein each of the method operations are embodied as program instructions on a computer readable medium.

9. The method of claim 1, further including,
    creating an executable code segment based on the data in the database to generate an algorithm for handling packet data for receipt by the functional block.

10. The method of claim 1, wherein receiving a register table further includes:
    receiving input from a user, the input defining the register table.

11. A system for designing an integrated circuit, comprising:
    a plurality of class databases having register information extracted from a register entry tool, each of the plurality of class databases corresponding to a functional block of the integrated circuit, the register information including characteristics to be implemented for the corresponding register within the functional block, the characteristics including a register name and a register type, wherein each register is divided into bit fields, each bit field having characteristics of a bit field name and a bit field width indicating a size of the bit field;
    a system integration tool for integrating the register information from each of the plurality of class databases into a system database; and
    a system application module having a plurality of application tools, the plurality of application tools including a document generator tool capable of generating user documentation for the integrated circuit from the class databases and a hardware description language (HDL) generator enabling a user to substitute a fixed configuration for a configurable register after designing the integrated circuit.

12. The system of claim 11, wherein the system database includes base address information for each functional block.

13. The system of claim 11, wherein the application module includes a HDL testbench generator that is enabled to generate a testbench for a variant of the functional block.

14. The system of claim 11, wherein the application module includes a debug graphical user interface (GUI) module for providing a debug GUI based on information within the system database, the debug GUI providing an interface for hardware testing of the integrated circuit.

15. The system of claim 14, further comprising:
a transport application programming interface enabling the debug GUI module to communicate with a simulator for testing the integrated circuit.

16. A system for compiling a register database for an integrated circuit design, comprising:
a bus;
a memory;
a processor in communication with the memory, through the bus, the processor operable to receive and execute instructions which cause the processor to perform a method comprising:
accessing data within a register entry tool, the data within the register entry tool identifying characteristics of registers within a functional block of the integrated circuit design, the characteristics including a register name and a register type, wherein each register is divided into bit fields, each bit field having characteristics of a bit field name and a bit field width indicating a size of the bit field;
extracting the data from the register entry tool into a class database; and
processing the data in the class database to generate a design specification for the functional block, the design specification being generated to implement the identified characteristics of the registers within the functional block.

17. The system of claim 16, wherein the memory includes register class application logic for providing functionality at a functional block level and register system application logic for providing functionality at system level.

18. The system of claim 17, further comprising:
repeating the accessing and the extracting for each functional block of the integrated circuit design; and
integrating data from each class database into a system database through a system integration tool.

19. The system of claim 18, further comprising:
processing the data integrated into the system database to generate testing data for use with a physical circuit.

* * * * *